(12) United States Patent
Tsai et al.

(10) Patent No.: US 10,453,620 B2
(45) Date of Patent: Oct. 22, 2019

(54) PEROVSKITE COMPOSITE STRUCTURE

(71) Applicant: Winbond Electronics Corp., Taichung (TW)

(72) Inventors: Ming-Chih Tsai, Taichung (TW); Yu-Hsuan Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/808,823

(22) Filed: Nov. 9, 2017

(65) Prior Publication Data

US 2018/0240607 A1 Aug. 23, 2018

(30) Foreign Application Priority Data

Feb. 21, 2017 (CN) .......................... 2017 1 0092678

(51) Int. Cl.
*H01G 9/20* (2006.01)
*H01L 51/42* (2006.01)
*H01L 51/00* (2006.01)

(52) U.S. Cl.
CPC .............. *H01G 9/2018* (2013.01); *H01G 9/20* (2013.01); *H01L 51/42* (2013.01); *H01L 51/4253* (2013.01); *C01P 2002/34* (2013.01); *H01L 51/0077* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | | |
|---|---|---|---|---|
| 2015/0340632 A1* | 11/2015 | Etgar | ................. | H01L 51/4226 136/255 |
| 2015/0357591 A1* | 12/2015 | Karunadasa | ........ | H01L 51/4226 136/256 |
| 2016/0133392 A1* | 5/2016 | Sato | ...................... | H01L 51/422 136/255 |
| 2017/0044683 A1* | 2/2017 | Cullen | .................... | C01B 25/00 |
| 2017/0243699 A1* | 8/2017 | Beaumont | ........... | H01L 51/4226 |

FOREIGN PATENT DOCUMENTS

| | | |
|---|---|---|
| CN | 103346018 | 10/2013 |
| JP | 2004119279 | 4/2004 |
| JP | 2017501576 | 1/2017 |
| WO | 2016060154 | 4/2016 |
| WO | 2017184292 | 10/2017 |

OTHER PUBLICATIONS

"Office Action of Taiwan Counterpart Application," dated Jan. 15, 2018, p. 1-p. 4.
"Office Action of Japan Counterpart Application," dated Mar. 5, 2019, p. 1-p. 5.

* cited by examiner

*Primary Examiner* — Katie L. Hammer
(74) *Attorney, Agent, or Firm* — JCIPRNET

(57) ABSTRACT

A perovskite composite structure is provided. The perovskite composite structure includes a light absorption layer and a sterically-hindered layer disposed in the periphery of the light absorption layer. The light absorption layer includes a perovskite material. The sterically-hindered layer includes a two-dimensional material.

6 Claims, 1 Drawing Sheet

PEROVSKITE COMPOSITE STRUCTURE

CROSS-REFERENCE TO RELATED APPLICATION

This application claims the priority benefit of China application serial no. 201710092678.0, filed on Feb. 21, 2017. The entirety of the above-mentioned patent application is hereby incorporated by reference herein and made a part of this specification.

BACKGROUND OF THE INVENTION

Field of the Invention

The invention relates to a composite structure, and more particularly, to a perovskite composite structure.

Description of Related Art

The organic-inorganic hybrid perovskite material has high light absorption and high electron mobility, and can change the light absorption band via changes in the components thereof, and therefore a solar cell made from the organic-inorganic hybrid perovskite material has high efficiency. However, the organic-inorganic hybrid perovskite material is limited by technical issues such as (1) moisture and oxygen-proof process environment, (2) unstable product in atmospheric environment, and (3) inability to successfully grow a continuous crystal.

Therefore, the development of a perovskite material suitable for use in a wet process that is stable in atmospheric environment and has high electron mobility is an important issue for those skilled in the art.

SUMMARY OF THE INVENTION

The invention provides a perovskite composite structure that is stable in atmospheric environment and has high electron mobility.

The perovskite composite structure of the invention includes a light absorption layer and a sterically-hindered layer located in the periphery of the light absorption layer. The light absorption layer includes a perovskite material. The sterically-hindered layer includes a two-dimensional material.

In an embodiment of the invention, the perovskite material can have the structure of formula (1) below:

$$ABX_3 \qquad (1),$$

wherein A is ammonia ($NH_3$), methylamine ($CH_3NH_2$), methanimidamide ($CH_4N_2$), aminomethanamidine ($HNC(NH_2)_2$), formamidine ($HC(NH)NH_2$), ethylenediamine ($C_2H_4(NH_2)_2$), dimethylamine (($CH_3)_2NH$), imidazole ($C_3H_4N_2$), acetamidine ($CH_3CNHNH_2$), propylamine ($C_3H_7NH_2$), isopropylamine (iso-$C_3H_7NH_2$), trimethylenediamine ($(CH_2)_3(NH_2)_2$), ethylamine, butylamine ($C_4H_9NH_2$), isobutylamine (iso-$C_4H_9NH_2$), tert-butylamine (($CH_3)_3CNH_2$), diethylamine (($C_2H_5)_2NH$), 5-aminovaleric acid ($NH_2(CH_2)_4COOH$), thiophenemethylamine ($C_5H_7NS$), hexylamine ($C_6H_{13}NH_2$), aniline ($C_6H_5NH_2$), benzylamine ($C_6H_5CH_2NH_2$), phenylethylamine ($C_6H_5C_2H_4NH_2$), octylamine ($C_8H_{17}NH_2$), decylamine ($C_{10}H_{21}NH_2$), dodecylamine ($C_{12}H_{25}NH_2$), tetradecylamine ($C_{14}H_{29}NH_2$), hexadecylamine ($C_{16}H_{33}NH_2$), oleylamine ($C_{18}H_{35}NH_2$), octadecylamine ($C_{18}H_{37}NH_2$), eicosylamine ($C_{20}H_{41}NH_2$), Li, Na, K, Rb, Cs, or Cu; B is Cd, Co, Cr, Cu, Fe, Ge, Pb, or Sn; and X is Cl, Br, I, cyanide (CN), cyanate (NCO), thiocyanate (NCS), selenocyanate (SeCN), or tellurocyanate (TeCN).

In an embodiment of the invention, the two-dimensional material is, for instance, bismuth sulfide ($Bi_2S_3$) black phosphorus, hexagonal boron nitride (h-BN), graphene, graphene oxide (GO), reduced graphene oxide (rGO), indium selenide ($In_2Se_3$), lead tin disulfide ($PbSnS_2$), phosphorene, arsenic sulfide ($As_2S_3$), antimony arsenic sulfide ($SbAsS_3$); monochalcogenide (MX) such as bismuth thallium telluride (BiTlTe), copper sulfide (CuS), gallium selenide (GaSe), gallium selenide telluride (GaSeTe), gallium sulfide (GaS), gallium sulfide selenide (GaSSe), gallium telluride (GaTe), germanium selenide (GeSe), germanium sulphide (GeS), indium selenide (InSe), indium telluride (InTe), thallium selenide (TlSe), tin selenide (SnSe), thallium gallium disulfide ($TlGaS_2$), thallium gallium diselenide ($TlGaSe_2$), thallium indium disulfide ($TlInS_2$); dichalcogenide ($MX_2$) such as hafnium diselenide ($HfSe_2$), hafnium disulfide ($HfS_2$), molybdenum diselenide ($MoSe_2$), molybdenum disulfide ($MoS_2$), molybdenum sulfide selenide (MoSSe), molybdenum tungsten diselenide ($MoWSe_2$), molybdenum tungsten disulfide ($MoWS_2$), tungsten disulfide ($WS_2$), tungsten diselenide ($WSe_2$), rhenium diselenide ($ReSe_2$), tantalum disulfide ($TaS_2$), tin diselenide ($SnSe_2$), tin disulfide ($SnS_2$), rhenium molybdenum disulfide ($ReMoS_2$), rhenium niobium diselenide ($ReNbSe_2$), rhenium niobium disulfide ($ReNbS_2$), tungsten ditelluride ($WTe_2$), tungsten sulfide selenide (WSSe), zirconium diselenide ($ZrSe_2$), zirconium disulfide ($ZrS_2$), zirconium ditelluride ($ZrTe_2$); trichalcogenide ($MX_3$) such as titanium trisulfide ($TiS_3$); iodide ($MI_2$) such as cadmium diiodide ($CdI_2$), lead diiodide ($PbI_2$), or a combination thereof (including one or more).

In an embodiment of the invention, the light absorption layer can further include the two-dimensional material.

In an embodiment of the invention, the sterically-hindered layer further includes organic amine.

In an embodiment of the invention, the organic amine is, for instance, ammonia, methylamine, methanimidamide, aminomethanamidine, formamidine, ethylenediamine, dimethylamine, imidazole, acetamidine, propylamine, isopropylamine, trimethylenediamine, ethylamine, butylamine, isobutylamine, tert-butylamine, diethylamine, 5-aminovaleric acid, thiophenemethylamine, hexylamine, aniline, benzylamine, phenylethylamine, octylamine, decylamine, dodecylamine, tetradecylamine, hexadecylamine, oleylamine, octadecylamine, eicosylamine, or a combination thereof (including one or more).

In an embodiment of the invention, the length of the two-dimensional material is, for instance, 0.5 μm to 10 μm.

Based on the above, in the perovskite composite structure of the invention, the sterically-hindered layer located in the periphery of the light absorption layer having a perovskite material can block moisture and air, and is therefore stable in atmospheric environment. Moreover, since the light absorption layer and/or the sterically-hindered layer of the perovskite composite structure of the invention includes a two-dimensional material, the electron transport capability of the perovskite can be increased.

In order to make the aforementioned features and advantages of the disclosure more comprehensible, embodiments accompanied with FIGURES are described in detail below.

BRIEF DESCRIPTION OF THE DRAWINGS

The accompanying drawings are included to provide a further understanding of the invention, and are incorporated

DESCRIPTION OF THE EMBODIMENTS

Figure 1:
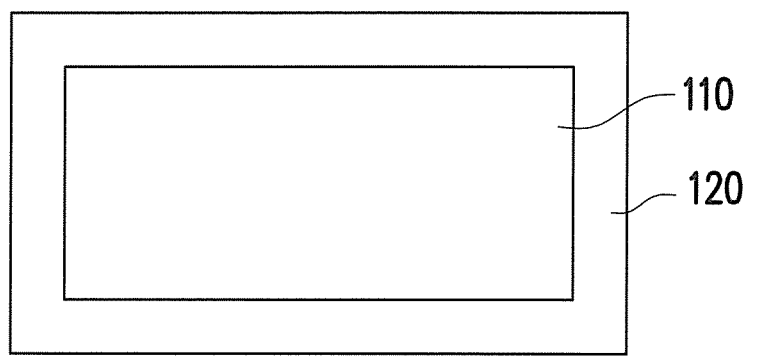
FIG. 1 is a cross-sectional schematic diagram of a perovskite composite structure according to an embodiment of the invention.

FIG. 1 is a cross-sectional schematic diagram of a perovskite composite structure according to an embodiment of the invention.

Referring to FIG. 1, a perovskite composite structure 100 of the present embodiment includes a light absorption layer 110 and a sterically-hindered layer 120. The light absorption layer 110 includes a perovskite material. In the invention, "perovskite material" refers to a material having a "perovskite structure" and not calcium titanate ($CaTiO_3$) in particular. In other words, "perovskite material" contains any material having a crystal structure of a similar type to perovskite oxide. The perovskite material has the structure shown in formula (1) below:

$$ABX_3 \qquad (1),$$

wherein A and B are cations and X is an anion. The A cation is monovalent and the B cation is divalent.

For instance, in the present embodiment, A is, for instance, ammonia, methylamine, methanimidamide, aminomethanamidine, formamidine, ethylenediamine, dimethylamine, imidazole, acetamidine, propylamine, isopropylamine, trimethylenediamine, ethylamine, butylamine, isobutylamine, tert-butylamine, diethylamine, 5-aminovaleric acid, thiophenemethylamine, hexylamine, aniline, benzylamine, phenylethylamine, octylamine, decylamine, dodecylamine, tetradecylamine, hexadecylamine, oleylamine, octadecylamine, eicosylamine, Li, Na, K, Rb, Cs, or Cu; and B is Cd, Co, Cr, Cu, Fe, Ge, Pb, or Sn; and X is Cl, Br, I, cyanide (CN), cyanate (NCO), thiocyanate (NCS), selenocyanate (SeCN), or tellurocyanate (TeCN), but the invention is not limited thereto. In other words, the perovskite material of the present embodiment is an organic-inorganic hybrid perovskite material formed by an inorganic material and an organic material.

Since the organic-inorganic hybrid perovskite material of the invention is a material formed by mixing, the organic-inorganic hybrid perovskite material of the invention has the characteristics of both an organic compound and an inorganic crystal. The inorganic component is formed by a framework covalently bonded and ionic interaction, and can provide high carrier mobility. The organic component facilitates the self-assembly mechanism of the materials. Moreover, the electrical properties of the organic and inorganic materials can be adjusted by lowering the dimensionality of the organic component and the electronic coupling between inorganic sheet materials.

In the present embodiment, the light absorption layer 110 can further include a two-dimensional material. The two-dimensional material is, for instance, bismuth sulfide ($Bi_2S_3$) black phosphorus, hexagonal boron nitride (h-BN), graphene, graphene oxide (GO), reduced graphene oxide (rGO), indium selenide ($In_2Se_3$), lead tin disulfide ($PbSnS_2$), phosphorene, arsenic sulfide ($As_2S_3$), antimony arsenic sulfide ($SbAsS_3$); monochalcogenide (MX) such as bismuth thallium telluride (BiTlTe), copper sulfide (CuS), gallium selenide (GaSe), gallium selenide telluride (GaSeTe), gallium sulfide (GaS), gallium sulfide selenide (GaSSe), gallium telluride (GaTe), germanium selenide (GeSe), germanium sulphide (GeS), indium selenide (InSe), indium telluride (InTe), thallium selenide (TlSe), tin selenide (SnSe), thallium gallium disulfide ($TlGaS_2$), thallium gallium diselenide ($TlGaSe_2$), thallium indium disulfide ($TlInS_2$); dichalcogenide ($MX_2$) such as hafnium diselenide ($HfSe_2$), hafnium disulfide ($HfS_2$), molybdenum diselenide ($MoSe_2$), molybdenum disulfide ($MoS_2$), molybdenum sulfide selenide (MoSSe), molybdenum tungsten diselenide ($MoWSe_2$), molybdenum tungsten disulfide ($MoWS_2$), tungsten disulfide ($WS_2$), tungsten diselenide ($WSe_2$), rhenium diselenide ($ReSe_2$), tantalum disulfide ($TaS_2$), tin diselenide ($SnSe_2$), tin disulfide ($SnS_2$), rhenium molybdenum disulfide ($ReMoS_2$), rhenium niobium diselenide ($ReNbSe_2$), rhenium niobium disulfide ($ReNbS_2$), tungsten ditelluride ($WTe_2$), tungsten sulfide selenide (WSSe), zirconium diselenide ($ZrSe_2$), zirconium disulfide ($ZrS_2$), zirconium ditelluride ($ZrTe_2$); trichalcogenide ($MX_3$) such as titanium trisulfide ($TiS_3$); iodide ($MI_2$) such as cadmium diiodide ($CdI_2$), lead diiodide ($PbI_2$), or a combination thereof (including one or more), but the invention is not limited thereto. The length of the two-dimensional material is, for instance, 0.2 µm to 20 µm. In the present embodiment, since the light absorption layer 110 includes a two-dimensional material having high electron mobility, the electron transport capability and light conversion efficiency of perovskite can be increased.

The sterically-hindered layer 120 is located in the periphery of the light absorption layer 110. The sterically-hindered layer 120 can include a two-dimensional material. The two-dimensional material is, for instance, bismuth sulfide ($Bi_2S_3$) black phosphorus, hexagonal boron nitride (h-BN), graphene, graphene oxide (GO), reduced graphene oxide (rGO), indium selenide ($In_2Se_3$), lead tin disulfide ($PbSnS_2$), phosphorene, arsenic sulfide ($As_2S_3$), antimony arsenic sulfide ($SbAsS_3$); monochalcogenide (MX) such as bismuth thallium telluride (BiTlTe), copper sulfide (CuS), gallium selenide (GaSe), gallium selenide telluride (GaSeTe), gallium sulfide (GaS), gallium sulfide selenide (GaSSe), gallium telluride (GaTe), germanium selenide (GeSe), germanium sulphide (GeS), indium selenide (InSe), indium telluride (InTe), thallium selenide (TlSe), tin selenide (SnSe), thallium gallium disulfide ($TlGaS_2$), thallium gallium diselenide ($TlGaSe_2$), thallium indium disulfide ($TlInS_2$); dichalcogenide ($MX_2$) such as hafnium diselenide ($HfSe_2$), hafnium disulfide ($HfS_2$), molybdenum diselenide ($MoSe_2$), molybdenum disulfide ($MoS_2$), molybdenum sulfide selenide (MoSSe), molybdenum tungsten diselenide ($MoWSe_2$), molybdenum tungsten disulfide ($MoWS_2$), tungsten disulfide ($WS_2$), tungsten diselenide ($WSe_2$), rhenium diselenide ($ReSe_2$), tantalum disulfide ($TaS_2$), tin diselenide ($SnSe_2$), tin disulfide ($SnS_2$), rhenium molybdenum disulfide ($ReMoS_2$), rhenium niobium diselenide ($ReNbSe_2$), rhenium niobium disulfide ($ReNbS_2$), tungsten ditelluride ($WTe_2$), tungsten sulfide selenide (WSSe), zirconium diselenide ($ZrSe_2$), zirconium disulfide ($ZrS_2$), zirconium ditelluride ($ZrTe_2$); trichalcogenide ($MX_3$) such as titanium trisulfide ($TiS_3$); iodide ($MI_2$) such as cadmium diiodide ($CdI_2$), lead diiodide ($PbI_2$), or a combination thereof (including one or more), but the invention is not limited thereto. The length of the two-dimensional material is, for instance, 0.2 µm to 20 µm. In the present embodiment, since the sterically-hindered layer 120 includes the two-dimensional material and is located in the periphery of the light absorption layer 110, stereoscopic blocking function is achieved to block moisture. In other words, the sterically-hindered layer 120 can prevent contact of moisture and air with the light absorption layer 110 (in particular the perovskite material in the light absorption layer 110), and therefore the perovskite composite structure of the invention is relatively stable in atmospheric environment.

Moreover, in the present embodiment, since the two-dimensional material in the sterically-hindered layer 120 has high electron mobility, the sterically-hindered layer 120 can increase the electron transport capability and light conversion efficiency of perovskite.

In the present embodiment, the sterically-hindered layer 120 can further include organic amine. The organic amine is, for instance, ammonia, methylamine, methanimidamide, aminomethanamidine, formamidine, ethylenediamine, dimethylamine, imidazole, acetamidine, propylamine, isopropylamine, trimethylenediamine, ethylamine, butylamine, isobutylamine, tert-butylamine, diethylamine, 5-aminovaleric acid, thiophenemethylamine, hexylamine, aniline, benzylamine, phenylethylamine, octylamine, decylamine, dodecylamine, tetradecylamine, hexadecylamine, oleylamine, octadecylamine, eicosylamine, or a combination thereof (including one or more). In the present embodiment, the organic amine in the sterically-hindered layer 120 has a function similar to "passivation" and can prevent contact of moisture and air with the light absorption layer 110 (in particular the perovskite material in the light absorption layer 110), and therefore the perovskite composite structure of the invention is relatively stable in atmospheric environment.

Based on the above, in the perovskite composite structure of the invention, the sterically-hindered layer located in the periphery of the light absorption layer having a perovskite material can block moisture and air, and is therefore stable in atmospheric environment. Moreover, since the light absorption layer and/or the sterically-hindered layer of the perovskite composite structure of the invention includes a two-dimensional material, the electron transport capability of the perovskite can be increased. Since the perovskite composite structure of the invention has advantages such as stability in atmospheric environment, high electron transport capability, and high light conversion efficiency, the perovskite composite structure of the invention is suitable for, for instance, a highly-sensitive light sensor and solar cell.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A perovskite composite structure, comprising:
   a light absorption layer comprising a perovskite material, wherein the perovskite material has a structure of formula (1) below:

$$ABX_3 \qquad (1),$$

wherein A is ammonia, methylamine, methanimidamide, aminomethanamidine, formamidine, ethylenediamine, dimethylamine, imidazole, acetamidine, propylamine, isopropylamine, trimethylenediamine, ethylamine, butylamine, isobutylamine, tert-butylamine, diethylamine, 5-aminovaleric acid, 2-thienylmethylamine, hexylamine, aniline, benzylamine, phenyl ethyl amine, octylamine, decylamine, dodecylamine, tetradecylamine, hexadecylamine, oleylamine, octadecylamine, eicosylamine, Li, Na, K, Rb, Cs, or Cu; B is Cd, Co, Cr, Cu, Fe, Ge, Pb, or Sn; and X is Cl, Br, I, cyanide (CN), cyanate (NCO), thiocyanate (NCS), selenocyanate (SeCN), or tellurocyanate (TeCN); and
   a sterically-hindered layer located in a periphery of the light absorption layer,
   wherein the sterically-hindered layer comprises a two-dimensional material which is different from the perovskite material, and the two-dimensional material comprises bismuth sulfide ($Bi_2S_3$) black phosphorus, hexagonal boron nitride (h-BN), graphene, graphene oxide (GO), reduced graphene oxide (rGO), indium selenide ($In_2Se_3$), lead tin disulfide ($PbSnS_2$), phosphorene, arsenic sulfide ($As_2S_3$), antimony arsenic sulfide ($SbAsS_3$); monochalcogenide (MX), wherein MX is bismuth thallium telluride (BiTlTe), copper sulfide (CuS), gallium selenide (GaSe), gallium selenide telluride (GaSeTe), gallium sulfide (GaS), gallium sulfide selenide (GaSSe), gallium telluride (GaTe), germanium selenide (GeSe), germanium sulphide (GeS), indium selenide (InSe), indium telluride (InTe), thallium selenide (TlSe), tin selenide (SnSe), thallium gallium disulfide ($TlGaS_2$), thallium gallium diselenide ($TlGaSe_2$), thallium indium disulfide ($TlInS_2$); dichalcogenide ($MX_2$), wherein $MX_2$ is hafnium diselenide ($HfSe_2$), hafnium disulfide ($HfS_2$), molybdenum diselenide ($MoSe_2$), molybdenum disulfide ($MoS_2$), molybdenum sulfide selenide (MoSSe), molybdenum tungsten diselenide ($MoWSe_2$), molybdenum tungsten disulfide ($MoWS_2$), tungsten disulfide ($WS_2$), tungsten diselenide ($WSe_2$), rhenium diselenide ($ReSe_2$), tantalum disulfide ($TaS_2$), tin diselenide ($SnSe_2$), tin disulfide ($SnS_2$), rhenium molybdenum disulfide ($ReMoS_2$), rhenium niobium diselenide ($ReNbSe_2$), rhenium niobium disulfide ($ReNbS_2$), tungsten ditelluride ($WTe_2$), tungsten sulfide selenide (WSSe), zirconium diselenide ($ZrSe_2$), zirconium disulfide ($ZrS_2$), zirconium ditelluride ($ZrTe_2$); trichalcogenide ($MX_3$), wherein $MX_3$ is titanium trisulfide ($TiS_3$); iodide ($MI_2$), wherein $MI_2$ is cadmium diiodide ($CdI_2$) lead diiodide ($PbI_2$) or a combination thereof.

2. The perovskite composite structure of claim 1, wherein the light absorption layer further comprises the two-dimensional material.

3. The perovskite composite structure of claim 2, wherein the sterically-hindered layer further comprises an organic amine.

4. The perovskite composite structure of claim 3, wherein the organic amine comprises ammonia, methyl amine, methanimidamide, aminomethanamidine, formamidine, ethylenediamine, dimethylamine, imidazole, acetamidine, propylamine, isopropylamine, trimethylenediamine, ethylamine, butylamine, isobutylamine, tert-butylamine, diethylamine, 5-aminovaleric acid, thiophenemethylamine, hexylamine, aniline, benzylamine, phenylethylamine, octylamine, decylamine, dodecylamine, tetradecylamine, hexadecylamine, oleylamine, octadecylamine, eicosylamine, or a combination thereof.

5. The perovskite composite structure of claim 1, wherein a length of the two-dimensional material in the sterically-hindered layer is 0.2 μm to 20 μm.

6. The perovskite composite structure of claim 2, wherein a length of the two-dimensional material in the light absorption layer is 0.2 μm to 20 μm.

* * * * *